Aug. 22, 1967 F. L. VOGEL, JR 3,337,379

METHOD OF MAKING SEMICONDUCTIVE DEVICES BY MEANS OF A CARRIER GAS WITH IMPURITIES

Filed Dec. 23, 1964

INVENTOR

Ferdinand Lincoln Vogel, Jr.

BY Connolly and Hutz

ATTORNEYS 3,337,379

METHOD OF MAKING SEMICONDUCTIVE DEVICES BY MEANS OF A CARRIER GAS WITH IMPURITIES

Ferdinand Lincoln Vogel, Jr., Williamstown, Mass., assignor to Sprague Electric Company, North Adams, Mass., a corporation of Massachusetts Filed Dec. 23, 1964, Ser. No. 420,684
2 Claims. (Cl. 148—189)

ABSTRACT OF THE DISCLOSURE

A semiconductive body is heated in the presence of an injected flow of relatively cooler, impurity carrying gas and in the vicinity of peripheral cooling means so as to provide a convective flow of gas across the injected flow and thus a combined flow around the body which produces a uniform impurity distribution therein.

This invention relates to a process for making a semiconductive device having regions of different conductivity types separated by P-N junctions, and more particularly to producing conductivity regions by diffusion.

Electrical circuit structures in which semiconductive devices are fabricated in an integral body with other components are highly desirable. Particularly it is desirable to fabricate in a single body of material of small size a number of electronic components including semiconductive devices. Semiconductive materials such as germanium or silicon have conductivity types designated N-type and P-type depending upon the presence of donor or acceptor impurities. For example, boron, aluminum, indium and gallium provide P-type conductivity; and phosphorus, antimony and bismuth provide N-type conductivity. It will be understood that these examples of impurities are set forth merely by way of illustration. Distribution gradients of the impurities in the semiconductive material, such as wafer or slice, influence the characteristics of devices incorporated in the wafer.

Diffusion of impurities such as those referred to above produce an impurity distribution in the semiconductive material. This impurity distribution in turn is related to other steps in the device fabrication technique and in the operation of the eventual product component. A uniform concentration during impurity diffusion into a body of semiconductive material is desirable and important in certain aspects of the production of semiconductive devices, particularly in the creation of semiconductive devices in a single body of material with other unitary circuit structures.

An impurity may be diffused into a body by causing a gas containing the impurity to deposit the impurity on a surface of the body in a gaseous atmosphere. As a result of heating the body the impurity diffuses into the body to influence conductivity in a manner dependent upon the temperature and time of heating.

A substrate, such as a wafer or slice, may be used as a body in which a number of devices are formed. As a part of the production of such devices, it is important to be able to distribute impurities in the substrate so as to result in a uniform concentration of the impurities in the substrate.

It is an object of this invention to produce a uniform concentration of a diffused impurity in a semiconductive body.

It is another object of this invention to produce uniformity of impurity diffusion and concentration distribution control across an entire semiconductive body.

It is another object of this invention to provide a more easily fabricated semiconductive device in a single body of material with other unitary circuit substrates by the uniform diffusion of an impurity into a semiconductive body.

Figure 1:
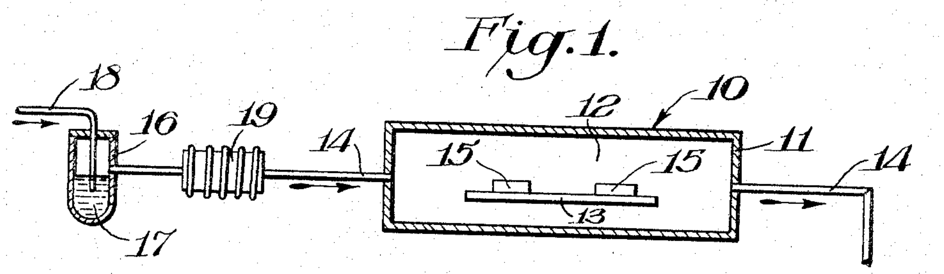
Figure 2:
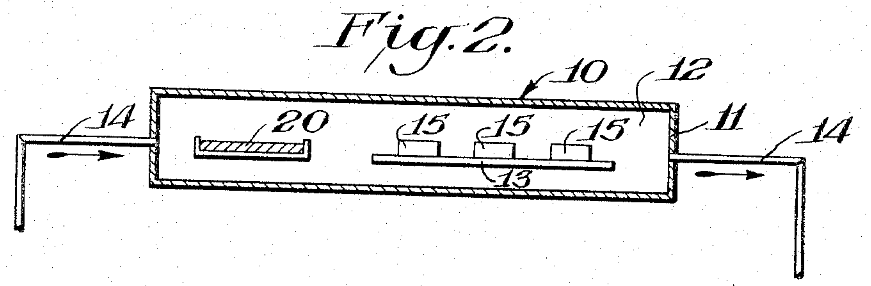

These and other objects of this invention will become more apparent upon consideration of the following description taken together with the accompanying drawing, in which:

FIGURE 1 is a diagram depicting the means of diffusing an impurity into a semiconductive body; and FIGURE 2 is a diagram illustrating a modified means of diffusing an impurity into a semiconductive body.

In general, this invention provides for a uniform diffusion of impurities through the surface of a body for a semiconductive device. A flow of gas containing the conductivity-type determining impurities over the body in a diffusion chamber provides a uniform impurity concentration. The uniform distribution is achieved by the axial flow caused by injection of the gas and a convective flow of the gas within the diffusion chamber.

The convective flow is accomplished by novel heating means in the central zone of the diffusion chamber. The central zone is heated to a temperature substantially above the temperature of the peripheral walls of the enclosing chamber. The semiconductive body is mounted in this central zone for receiving the diffusant. The heat of the central zone aided by the relatively cooler wall of the chamber cause the convective flow within the chamber. The cool peripheral wall cools the gas in the convective flow providing a differential which perpetuates the motion of the gas through the chamber and past the semiconductive body.

More specifically, this invention provides a diffusion apparatus in which a tubular member with a peripheral wall which forms a chamber contains a volume of enclosed gas. Centrally located in the chamber is a heating element which heats a central zone of the enclosed volume to a temperature substantially in excess of the temperature of the periphery of the enclosed volume of gas at the peripheral wall. The heat in the central zone heats a gaseous mixture within the enclosed volume. The gaseous mixture consists essentially of a carrier gas, such as nitrogen or oxygen, and the vapor of conductivity-type determining impurities, or impurity compounds, such as oxides or halides. The injected gas moves within the chamber and is cooled at the periphery to result in a convective flow.

The apparatus of this invention provides means for introducing a vapor of the conductivity-type determining impurities into the gas. The chamber also contains in the heated central zone a semiconductive body such as a semiconductive wafer into which the impurity is diffused. The impurity vapor is transported in the gas after being introduced into the gas and is diffused into the semiconductive wafer forming a layer of the conductivity type of the impurity in uniform concentration in the semiconductive body.

Referring to the figures, FIGURE 1 shows an elongated container 10 having an outer wall 11 forming a chamber 12. The chamber 12 contains a centrally positioned heater 13. Conduits 14 are provided for the passage of gas through this chamber 12. Wafers 15 are positioned in the central zone at the heater 13 and directly heated thereby. The wafer 15 is the subject that is acted upon by the method and means of this invention to become a suitably doped semiconductive body.

In this novel container 10 the centrally located heater 13 heats the volume of gas in the chamber 12. The outer wall 11 substantially spaced away from this heated central zone remains relatively cool. The heated gas in the chamber 12 contains conductivity-type determining impurities. In the embodiment of FIGURE 1 these impurities are introduced by bubbling the gas through a liquid. This bubbling is carried out in a bubbling apparatus 16 in which a liquid 17 contains the impurity. The impurity is introduced in the carrier gas by passing the carrier gas through a bubbler stem 18 which extends into the liquid 17. The gas mixture is then removed through the conduit 14 to a preheater 19 which is heated to a suitable temperature by heat coils.

The gas mixture is then transported to the container 10 and injected into the chamber 12 through the conduit 14. The impurity-containing vapor moving with the carrier gas is carried across the chamber 12 to the wafers 15 by the convective flow, and the impurity is diffused uniformly into the wafers. Under the heated conditions that cause the convective flow in the central zone in chamber 12 the impurities are diffused into the wafers 15. The convective flow created by the differential between the centrally heated zone and the cool peripheral area at wall 11 applies the impurity vapor to the wafers 15 in an even distribution.

The central zone is heated, for example, to above 1000° C. with the wafers 15 at a temperature in the range of 1000–1300° C. The relatively cool area at wall 11 is above room temperature to about 200° C. The liquid 17 is at room temperature and the preheater 19 is at a temperature of around 200° C. The wall 11 is spaced away from the central hot zone sufficiently to insure the desired convection. For example, the illustrated proportions are representative. The diffusant is maintained uniformly distributed in the gas moving across this space by the convective flow.

In the modification of FIGURE 2 the introduction of the impurity in the carrier gas is modified so that the diffusant source is contained within the container 10. The carrier gas is caused to flow across a supply 20 of the impurity. The carrier gas containing the diffusant picked up at the supply 20 is heated and moved by the convective flow produced in a similar manner to the temperature differential described above in connection with FIGURE 1.

Specific advantages of this means and method of this invention include a uniformity of the diffused impurity and a resultant homogeneity of resistivity and gradient of conductivity in the substrate body.

The apparatus and techniques of this invention set forth in the above description and illustrated in the accompanying drawings are presented in the embodiments for the purpose of illustration only. The principle of this invention is employed in variations. For example, it is possible to modify the manner of introducing the impurity into the carrier gas. Also the means for cooling the outer area can be varied. It will be understood that further modifications may be made within the spirit of the invention as exemplified in the modifications indicated above, and it is intended that the invention be limited solely by the scope of the appended claims.

What is claimed is:

1. The method of fabricating a semiconductive body which comprises heating a central zone containing a semiconductive body within a chamber to a temperature substantially in excess of the periphery of the chamber, injecting a carrier gas containing conductivity-type determining impurities in the central zone and heating it thereby, and providing cooling at the periphery of the chamber to maintain the periphery at a substantially lower temperature than the central zone so as to produce a convective flow of the gas across the injected flow and a combined flow in the central zone which transports impurities in the carrier gas to the body heated by the central zone and provides a substantially uniform diffusion of the impurities in the heated body and providing an opening at one end of the chamber for escape of the gas after completion of the convective flow across the said semiconductive body.

2. The method of fabricating a semiconductive body which comprises heating a central zone containing a semiconductive body within a chamber to a high temperature, injecting a preheated carrier gas containing conductivity-type determining impurities in the central zone and further heating the gas thereby, conducting heat away from the chamber at an area spaced away from the central zone and off the axis of the injected flow so as to maintain that area at a substantially lower temperature than the central zone and thereby produce a convective flow of the gas across the injected flow and a combined flow in the central zone which transports impurities in the gas to the body heated by the central zone and provides a substantially uniform diffusion of the impurities in the heated body and providing an opening at one end of the chamber for escape of the gas after completion of the convective flow across the said semiconductive body.

References Cited

UNITED STATES PATENTS

| | | | |
|---|---|---|---|
| 2,804,405 | 8/1957 | Derick | 148—189 |
| 2,928,761 | 3/1960 | Gremmelmaier | 148—189 |
| 3,007,816 | 11/1961 | McNamara | 148—189 |
| 3,113,056 | 3/1963 | Van Doorn | 148—189 |
| 3,148,094 | 9/1964 | Kenda | 148—1.6 |
| 3,152,022 | 10/1964 | Christensen | 148—175 |
| 3,178,798 | 4/1965 | Marinace | 148—189 |
| 3,205,102 | 9/1965 | McCaldin | 148—189 |

HYLAND BIZOT, *Primary Examiner.*